United States Patent [19]

Hartgring et al.

[11] Patent Number: 4,920,287
[45] Date of Patent: Apr. 24, 1990

[54] OUTPUT BUFFER HAVING REDUCED ELECTRIC FIELD DEGRADATION

[75] Inventors: Cornelis D. Hartgring, Dublin, Ireland; Jan Dikken; Tiemen Poorter, both of Eindhoven, Netherlands

[73] Assignee: U.S. Philips Corp., New York, N.Y.

[21] Appl. No.: 265,660

[22] Filed: Nov. 1, 1988

[30] Foreign Application Priority Data

Nov. 4, 1987 [NL] Netherlands ............... 8702630

[51] Int. Cl.$^5$ ............... H03K 17/04; H03K 17/06; H03K 17/687; H03K 19/003
[52] U.S. Cl. ............... 307/542; 307/296.8; 307/300; 307/443; 307/451; 307/585
[58] Field of Search ............... 307/450, 451, 452, 453, 307/481, 571, 572, 577, 579, 581, 584, 585, 591, 594, 592, 605, 270, 279, 269, 493, 234, 300, 296.1, 296.8

[56] References Cited

U.S. PATENT DOCUMENTS

| | | | |
|---|---|---|---|
| 4,100,438 | 7/1978 | Yokoyama | 307/304 |
| 4,521,698 | 6/1985 | Taylor | 307/270 X |
| 4,704,547 | 11/1987 | Kirsch | 307/542 X |

OTHER PUBLICATIONS

Dingwall, "Improved COS/MOS Inverter Circuit for Reducing Burnout and latch-up", RCA Tech. Notes, TN-1230, pp. 1-4, 7-25-79.

*Primary Examiner*—Stanley D. Miller
*Assistant Examiner*—David R. Bertelson
*Attorney, Agent, or Firm*—Steven R. Biren

[57] ABSTRACT

A digital circuit with a 5 V power supply voltage in which NMOS transistors constructed in sub-micron technology are protected against excessive field strengths by means of additional transistors in order to prevent so-called "hot carrier stress" for this purpose the additional transistors have a greater channel length and/or a higher threshold voltage.

5 Claims, 1 Drawing Sheet

OUTPUT BUFFER HAVING REDUCED ELECTRIC FIELD DEGRADATION

BACKGROUND OF THE INVENTION

The invention relates to an integrated digital circuit, comprising a MOS transistor of a first conductivity type whose drain is coupled to an output terminal and is connected to a first power supply terminal via a first sub-circuit, its gate being connected to a first input terminal while its source is connected to a second power supply terminal via a second sub-circuit, which second sub-circuit comprises at least one second MOS transistor of the first conductivity type, the first and the second sub-circuit being driven Via a second input terminal.

A circuit of the kind set forth is known from International patent application No. WO 86/03632 which discloses that a first transistor is connected in cascode with said second transistor in order to prevent an excessive voltage across the second transistor, which would mean that an associated high field strength at the drain of the second transistor would give rise to a real risk of so-called "hot carrier stress". The gate of the first transistor of the circuit disclosed in the cited International Patent Application receives a control voltage Vp which is equal to or smaller than the voltage $+V$ on the first power supply terminal. In the case of a customary standard power supply voltage (for example, 5 V), a control voltage Vp equal to this positive supply voltage is not suited to transistors having channel lengths which are smaller than, for example 1 $\mu$m (sub-micron), because the permissible maximum voltage beyond which "hot carrier stress" will occur across these transistors is smaller than that across transistors having greater channel lengths. In order to prevent "hot carrier stress", the control voltage Vp in said patent application should be smaller than the positive supply voltage (5 V) for sub-micron transistors. An additional circuit is required for generating control voltage Vp which is smaller than the positive power supply voltage.

SUMMARY OF THE INVENTION

It is an of the invention to provide an integrated digital circuit in which the risk of "hot carrier stress" is minimum for transistors and in which it is not necessary to use a circuit for generating a voltage which is lower than the supply voltage, the circuit still being suited to operation using a customary standard supply voltage (for example, 5 V).

To achieve this, an integrated digital circuit in accordance with the invention is characterized in that in order to suppress so-called "hot carrier stress" at least one of the following steps is taken: according to one step the first transistor has a threshold voltage which is higher than that of the second transistor, while according to another step the channel length of the first transistor is greater than that of the second transistor.

When the first transistor is replaced by a transistor having a higher threshold voltage, the maximum voltage occurring across the second transistor decreases, so that the risk of "hot carrier stress" also decreases.

When the channel length of the first transistor exceeds that of the second transistor, in the case of a capacitive load on the output terminal the capacitive load will be fully charged and discharged when the sub-circuits D1 and D2, respectively, are fully conductive. During the discharging of the capacitive load, substantially the full power supply voltage will be present across the main electrodes of the first transistor for some time (in contrast with the second transistor). As a result, the first transistor preferably has a greater channel length than the second transistor because the risk of "hot carrier stress" is less in the case of a greater channel length.

An integrated digital circuit in accordance with the invention offers the advantage that the additional circuit required for generating a voltage which is lower than the power supply voltage can be dispensed with, that the risk of "hot carrier stress" in the integrated digital circuit is minimum, and that the circuit can operate with a customary standard power supply voltage (for example, 5 V).

BRIEF DESCRIPTION OF THE DRAWING

Embodiments in accordance with the invention will be described in detail hereinafter with reference to the, in which.

DESCRIPTION OF THE PREFERRED EMBODIMENTS

Figure 1:
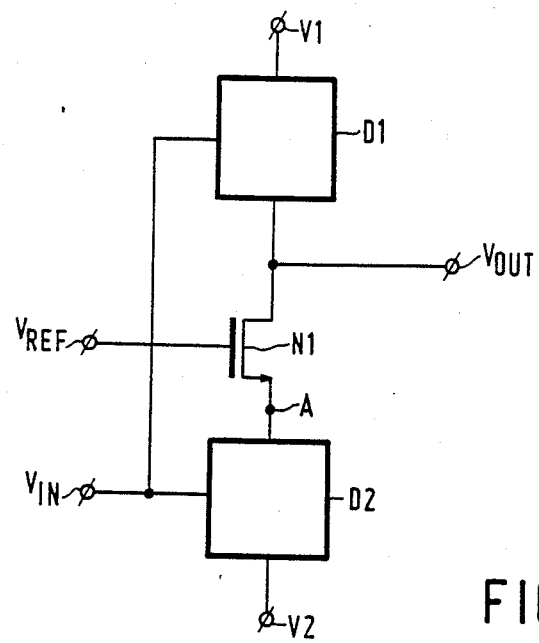
FIG. 1 shows an embodiment of an integrated digital circuit in accordance with the invention.

FIG. 1 shows an embodiment of an integrated digital circuit in accordance with the invention. The circuit comprises an NMOS transistor N1 and a first and a second sub-circuit, D1 and D2, respectively. The drain of the transistor N1 is connected to an output terminal $V_{OUT}$ and, via the sub-circuit D1, to a first power supply terminal V1. The source of the transistor N1 is coupled to a node A and, via the second sub-circuit D2, to a second power supply terminal V2. The gate of the transistor N1 is connected to the first input terminal $V_{REF}$. Moreover, the sub-circuits D1 and D2 are connected to an input terminal $V_{IN}$. The sub-circuit D1 may comprise one or more transistors or a resistor for realizing a logic circuit, and the sub-circuit D2 may also comprise one or more transistors. In order to realize, for example a logic inverter circuit, for example a PMOS transistor can be chosen for the sub-circuit D1 and an NMOS transistor for the sub-circuit D2. In order to realize a NAND-function with two logic inputs, a first and a second parallel-connected PMOS transistor can be chosen for the subcircuit D1 and two cascode-connected NMOS transistors for the subcircuit D2. The gate electrodes of the first PMOS transistor and the second NMOS transistor are then connected to one another and to the first logic input and the qate electrodes of the second PMOS transistor and the third NMOS transistor are connected to one another and to the second logic input. Another example is a NOR-function where the subcircuit D1 comprises two cascode-connected PMOS transistors and the subcircuit D2 comprises two parallel-connected NMOS transistors.

The transistor N1 serves to limit the voltage at the node A to a value for which no "hot carrier stress" occurs in one or more transistors of the sub-circuit D2.

The operation of the circuit shown in FIG. 1 is as follows; as an example of a digital circuit in this case a logic inverter circuit will be used where a PMOS transistor P1 is chosen for the sub-circuit D1 and an NMOS transistor N2 is chosen for the subcircuit D2, the gate of P1 also being connected to the input terminal $V_{IN}$. In the case of a logic high input signal on the input terminal $V_{IN}$, the transistor N2 will be conductive and the transistor P1 will be blocked. If $V_{REF}$ is sufficiently high, i.e. if $V_{REF} > V_A + V_{TH1}$, where $V_A$ is the voltage at the node A and $V_{TH1}$ is the threshold voltage of the transistor N1, the transistor N1 will be conductive and the output terminal $V_{OUT}$ will be logic low. In the case of a logic low input signal on the input terminal $V_{IN}$, the transistor N2 will be blocked and the transistor P1 will be conductive, so that the output terminal $V_{OUT}$ becomes logic high. The voltage at the node A will then reach a value equal to the voltage $V_A = V_{REF} - V_{TH1}$, which voltage is present across the drain and the source of the transistor N2. The maximum permissible voltage across the drain and the source of the latter transistor beyond which said "hot carrier stress" occurs depends inter alia on the channel length of the NMOS transistor and decreases as the channel length decreases. Simulations performed on an inverter circuit of the described kind, comprising a sub-micron PMOS transistor P1 and a sub-micron transistor N2, have demonstrated that the maximum permissible voltage on the drain of the transistor N2 is substantially lower than the voltage on the power supply terminal V1. In an NMOS transistor N2 having a channel length of 0.7 μm, "hot carrier stress" no longer occurs when the power supply voltage V1 is reduced to 4 V. When the input terminal $V_{REF}$ is connected to the power supply terminal V1, this means that either the threshold voltage of the transistor N1 should be sufficiently increased in order to ensure that the voltage on the node A does not become excessively high, or a voltage $V_{REF}$ should be chosen which is lower than the voltage on the power supply terminal V1 for the same threshold voltage of the transistors N1 and N2. For a transistor N2 having a channel length of 0.7 μm, it appears that "hot carrier stress" no longer occurs when either the threshold voltage $V_{TH1}$ is increased by approximately 0.8 V or the voltage $V_{REF}$ is decreased by approximately 0.8 V with respect to the power supply voltage V1. When the input signal $V_{IN}$ changes over from logic low to logic high, the node point A will carry a voltage equal to V2 after a very brief period of time, because the parasitic capacitance of the transistor N2 is discharged much more quickly than the capacitive load on the output terminal $V_{OUT}$. Because of the charge on the capacitive load on the terminal $V_{OUT}$ on the drain of the transistor N1 a potential difference will temporarily occur across the drain and the source of the transistor N1, which potential difference is substantially equal to the potential difference between the power supply terminals V1 and V2. In order to prevent "hot carrier stress" in the transistor N1, for this transistor a channel length can be chosen which is greater than the channel length of the transistor N2. Moreover, in the present example of a logic inverter circuit, the channel width of the transistor N1 can be chosen to be approximately equal to the channel width of the transistor N2 and generally, in the case of a set of transistors in the sub-circuit D2, approximately equal to the effective channel width of the set of transistors, in order to ensure that, in response to a changeover of the input signal) $V_{IN}$ from logic low to logic high, the voltage on the node A becomes higher than the voltage on the supply terminal V2, so that the full supply voltage difference between V1 and V2 will not occur across the drain and the source of the transistor N1, so that the risk of "hot carrier stress" in the transistor N1 is also reduced by this step. Effective width is to be understood to mean herein that a fictitious transistor having this width has the same conductivity as the set of transistors in the sub-circuit D2 when all these transistors are conductive. Because, as has already been mentioned, the sub-circuit D2 can comprise several NMOS transistors, depending on the logic function to be realized, all NMOS transistors in the sub-circuit D2 can be constructed to have a channel length of less than 1 μm when use is made of a single additional transistor N1 having a channel length which is larger than, for example 1 μm.

Figure 2:
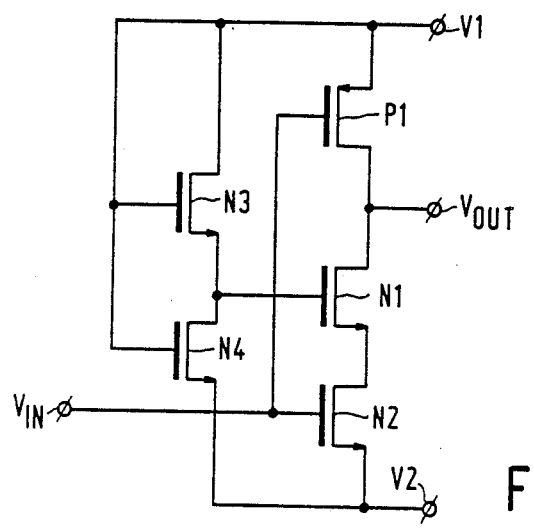
FIG. 2 shows a further embodiment of an integrated digital circuit in accordance with the invention.

FIG. 2 shows another embodiment of an integrated digital circuit in accordance with the invention. The circuit comprises a first, a second, a third and a fourth NMOS transistor, N1, N2, N3 and N4, respectively, and one PMOS transistor P1. The power supply terminal V1 is connected to the source of the transistor P1, to the drain and the gate of the transistor N3, and to the gate of the transistor N4. The source of the transistor N3 is coupled to the gate of the transistor N1 and to the drain of the transistor N4; the source of the transistor N4 is connected to the power supply terminal V2 and the two drains of the transistors N1 and P1 are connected to one another and to the output terminal $V_{OUT}$. The source of the transistor N1 is coupled to the drain of the transistor N2, the source of the transistor N2 being connected to the second power supply terminal V2. Furthermore, the gate connections of the transistors P1 and P2 are connected to the second input terminal $V_{IN}$.

The operation of the circuit shown in FIG. 2 is as follows: as an example of an integrated digital circuit use is again made of a logic inverter circuit as described above; however, the gate of the transistor N1 receives a signal which originates from the transistors N3 and N4. Because the gate of the transistor N3 is connected to the first power supply terminal, the gate of the transistor N1 receives a voltage equal to $V1-V_{TH3}$, $V_{TH3}$ being the threshold voltage of the transistor N3, because the transistor N3 carries a small current which is drained to the second power supply terminal V2 because the transistor N4 is conductive. The transistor N4 preferably has a large channel length in order to ensure that the current through the transistors N3 and N4 has a small value and hence the current consumption is low. The maximum voltage occurring on the drain of the transistor N2 thus amounts to $V1-V_{TH1}-V_{TH3}$, which is smaller than the maximum permissible voltage at which no "hot carrier stress" occurs, $V_{TH1}$ being the threshold voltage of the transistor N1. The transistors P1 and N2 form an inverter circuit which is known from the state of the art, i.e. in the case of a logic high input signal on the input terminal $V_{IN}$, the transistor N2 will be conductive and the transistor P1 will be blocked and the transistor N1 will also be conductive, so that the output terminal $V_{OUT}$ will be logic low; in the case of a logic low input signal on the input terminal $V_{IN}$, the transistor N2 will be blocked and the transistor P1 will be conductive, so that the output terminal $V_{OUT}$ will be logic high. The reference voltage $V_{REF}$ generated by the transistors N3 and N4 can be used for one or more digital sub-circuits, so that a reference voltage $V_{REF}$ need be generated only once in an integrated digital circuit. This means that, even though the transistor N4 is comparatively large because of its long channel length, it occupies a very small surface area in comparison with the sub-micron transistors in an integrated circuit.

The above description revealed how "hot carrier stress" can be limited in one or more NMOS transistors. To those skilled in the art, however, it will be apparent that similar steps for preventing "hot carrier stress" can also be taken for PMOS transistors, be it that PMOS transistors are not as susceptible to "hot carrier stress" as NMOS transistors because of the lower mobility of holes in PMOS transistors with respect to electrons in NMOS transistors. The invention can be used not only in integrated digital circuits as described above but also in integrated analog circuits.

What is claimed is:

1. An integrated digital circuit, comprising a first MOS transistor of a first conductivity type whose drain is coupled to an output terminal and being coupled to a first power supply terminal by a first means, its gate being connected to a first input terminal and its source being coupled to a second power supply terminal by a second means, said second means comprising at least one second MOS transistor of the first conductivity type, the first and the second means being driven by a second input terminal, and means for suppressing "hot carrier stress" by at least one of providing the first transistor with a threshold voltage which is higher than that of the second transistor and providing the first transistor with a channel length which is greater than that of the second transistor.

2. An integrated digital circuit as claimed in claim 1, characterized in that the first input terminal carries a voltage which has a level between that of the first and the second power supply voltage.

3. An integrated digital circuit as claimed in claim 1, characterized in that the first conductivity type is N-type.

4. An integrated digital circuit as claimed in claim 3 comprising a third MOS transistor, characterized in that the gate of the first transistor is connected to the first power supply terminal by said third NMOS transistor.

5. An integrated digital circuit as claimed in claim 1, 2, or 3, characterized in that the channel length of the first transistor is greater than 1 μm, the channel length of the second transistor being less than 1 μm.

* * * * *